(12) United States Patent
Yoo et al.

(10) Patent No.: US 9,747,985 B2
(45) Date of Patent: Aug. 29, 2017

(54) NON-VOLATILE INVERTER

(71) Applicant: Samsung Electronics Co., Ltd., Suwon-si, Gyeonggi-do (KR)

(72) Inventors: Inkyeong Yoo, Yongin-si (KR); Hojung Kim, Suwon-si (KR); Seongho Cho, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/206,791

(22) Filed: Jul. 11, 2016

(65) Prior Publication Data

US 2017/0084333 A1    Mar. 23, 2017

(30) Foreign Application Priority Data

Sep. 18, 2015  (KR) .......................... 10-2015-0132606

(51) Int. Cl.
  *G11C 16/04*   (2006.01)
  *H01L 27/11568*   (2017.01)
  (Continued)

(52) U.S. Cl.
  CPC .......... *G11C 16/0466* (2013.01); *G11C 16/10* (2013.01); *G11C 16/14* (2013.01); *G11C 16/26* (2013.01); *H01L 23/528* (2013.01); *H01L 27/11568* (2013.01); *H01L 45/08* (2013.01); *H01L 45/1233* (2013.01); *H01L 45/146* (2013.01)

(58) Field of Classification Search
  CPC .. G11C 16/04; G11C 16/3445; G11C 16/0483

USPC ....................................... 365/185.01-185.33
  See application file for complete search history.

(56) References Cited

U.S. PATENT DOCUMENTS

4,095,281 A    6/1978    Denes
5,587,603 A    12/1996   Kowshik
(Continued)

FOREIGN PATENT DOCUMENTS

KR    10-0560936 B1    3/2006

OTHER PUBLICATIONS

Johannes Schemmel et al, "Implementing Synaptic Plasticity in a VLSI Spiking Neural Network Model", Neural Networks, 2006.
(Continued)

*Primary Examiner* — Harry W Byrne
(74) *Attorney, Agent, or Firm* — Harness, Dickey & Pierce, P.L.C.

(57) ABSTRACT

A non-volatile inverter may be configured to perform a memory function. The non-volatile inverter may include first and second transistors. The first transistor may include a first gate electrode, a first electrode, and a second electrode. The second transistor may include a second gate electrode and a third electrode and may share the second electrode with the first transistor. The first transistor may include a first switching layer and a charge trap layer. The first switching layer may be configured to switch between a high resistance state and a low resistance state. The charge trap layer may be configured to trap or de-trap charges according to the resistance state of the first switching layer. The first switching layer may include a P-N diode. The second transistor may include a second gate switching layer and a charge trap layer.

29 Claims, 26 Drawing Sheets

(51) Int. Cl.
*H01L 23/528* (2006.01)
*H01L 45/00* (2006.01)
*G11C 16/10* (2006.01)
*G11C 16/26* (2006.01)
*G11C 16/14* (2006.01)

(56) References Cited

U.S. PATENT DOCUMENTS

| | | | |
|---|---|---|---|
| 5,847,993 | A | 12/1998 | Dejenfelt |
| 6,144,580 | A | 11/2000 | Murray |
| 6,349,055 | B1 | 2/2002 | Murray |
| 8,139,410 | B2 | 3/2012 | Ogura et al. |
| 9,006,710 | B2 * | 4/2015 | Lee .................... H01L 29/0673 257/288 |
| 2005/0104625 | A1 | 5/2005 | Park |
| 2008/0135904 | A1 | 6/2008 | Roizin et al. |
| 2008/0157186 | A1 | 7/2008 | Park et al. |
| 2008/0219052 | A1 | 9/2008 | Kucic |
| 2010/0299297 | A1 | 11/2010 | Breitwisch et al. |
| 2011/0153533 | A1 | 6/2011 | Jackson et al. |
| 2012/0235705 | A1 | 9/2012 | Abe et al. |
| 2013/0073497 | A1 | 3/2013 | Akopyan et al. |
| 2014/0258194 | A1 | 9/2014 | Towal et al. |

OTHER PUBLICATIONS

Reza Moazzami et al., Stress-Induced Current in Thin Silicon Dioxide Films, IEEE, 1992, pp. 92-139 to 92-142.
Paulo R. Bueno et al., Low-Voltage Varistor Based on $(Sn,Ti)O_2$ Ceramics, Institute of Chemistry, 2002, pp. 282-284.
Extended European Search Report dated Feb. 14, 2017 issued in corresponding European Application No. 16184745.4-1552.

* cited by examiner

NON-VOLATILE INVERTER

CROSS-REFERENCE TO RELATED APPLICATION

This application claims the benefit of Korean Patent Application No. 10-2015-0132606, filed on Sep. 18, 2015, in the Korean Intellectual Property Office, the disclosure of which is incorporated herein in its entirety by reference.

BACKGROUND

1. Field

The present disclosure relates to inverters having a non-volatile memory function.

2. Description of the Related Art

Recently, as demand for portable information devices such as smart phones has rapidly increased, the development of non-volatile memory devices that are highly integrated, have small sizes, high speed, and high reliability has been considered. Also, in order to reduce a space occupied by a computer memory system, which includes logic circuits and a memory storage device, an attempt to load a memory function to an inverter has been tried.

As a non-volatile memory device, a polysilicon-oxide-nitride-oxide-silicon (SONOS) memory device compatible with manufacturing processes according to the prior art and having high performance memory characteristics has been considered as a next-generation non-volatile memory device. A tunneling insulation layer formed of a silicon oxide film in a single layer has a low operating speed and large power consumption when a thickness thereof is increased. However, if the thickness of the tunneling insulation layer is reduced to improve an operating speed, a direct tunneling phenomenon and a stress induced leakage current may increase.

SUMMARY

Provided are inverters having non-volatile memory functions.

Additional aspects will be set forth in part in the description which follows and, in part, will be apparent from the description, or may be learned by practice of the presented exemplary embodiments.

According to an aspect of some example embodiments, a non-volatile inverter includes: a first transistor including a first gate electrode, a first electrode, a second electrode, a first switching layer, and a charge trap layer; a second transistor configured to share the second electrode with the first transistor and including a second gate electrode and a third electrode; an input line configured to connect the first gate electrode to the second gate electrode and including an input terminal; and an output line branching from the second electrode and including an output terminal. The first switching layer may have a resistance state and may be configured to switch the resistance state of the first switching layer between a high resistance state and a low resistance state. The charge trap layer may be configured to trap or de-trap charges according to the resistance state of the first switching layer.

The first transistor may be a P-channel transistor, and the second transistor may be an N-channel transistor.

The second transistor may further include a second switching layer having a resistance state and being configured to switch the resistance state of the second switching layer between a high resistance state and a low resistance state, and a second charge trap layer configured to trap or de-trap charges according to the resistance state of the second switching layer.

A resistance value of the first switching layer when the resistance state of the first switching layer is the high resistance state may be equal to or greater than about $1 \times 10^9$ ohms.

The first switching layer may include at least one of a chalcogenide-based material and a transition metal oxide.

The first switching layer may include a nano-filamentary material having nano-filaments, the first switching layer being configured to switch to a low resistance state based on the nano-filaments.

The nano-filamentary material may include TiOx.

The first switching layer may include a P-N diode.

The first transistor may include a gate insulating layer, the gate insulating layer having a tunneling voltage. The P-N diode may have a breakdown voltage smaller than the tunneling voltage.

The non-volatile inverter may be configured to perform a write operation in a pull-up mode when an output voltage output from the output terminal is greater than an input voltage applied to the input terminal.

Performing the write operation includes distributing a voltage to the first switching layer when a write voltage is applied to the first electrode. The distributed voltage may be at least equal to a switching voltage at which the first switching layer switches the resistance state of the first switching layer from the high resistance state to the low resistance state.

The first switching layer may be configured to switch the resistance state of the first switching layer from the low resistance state to the high resistance state when the write voltage is removed from the first electrode. Switching the resistance state of the first switching layer from the low resistance state to the high resistance state may include trapping charges in the charge trap layer.

The non-volatile inverter may be configured to perform a read operation such that A read voltage is applied to the first electrode, wherein the read voltage is smaller than the write voltage.

The non-volatile inverter may be configured to distribute voltage from the read voltage to the first switching layer, wherein the distributed voltage may be a voltage at which the first switching layer maintains the high resistance state.

the non-volatile inverter may be configured to perform an erase operation in a pull-down mode when an output voltage output from the output terminal is smaller than an input voltage applied to the input terminal.

Performing the erase operation may include distributing a voltage to the first switching layer when an erase voltage is applied to the first electrode, the erase voltage being less than the input voltage, and the distributed voltage may be equal to or greater than a switching voltage at which the first switching layer switches the resistance state of the first switching layer from the high resistance state to the low resistance state.

The first switching layer may be configured to switch the resistance state of the first switching layer from the low resistance state to the high resistance state when the erase voltage is removed from the first electrode, and switching the resistance state of the first switching layer from the low resistance state to the high resistance state includes maintaining a de-trap state of charges in the charge trap layer.

According to an aspect of some example embodiments, a non-volatile inverter includes: a semiconductor substrate; a first drain region and a first source region formed on the semiconductor substrate, a second drain region and a second source region formed on the semiconductor substrate; a first channel region between the first drain region and the first source region; a second channel region between the second drain region and the second source region; a first switching layer on the first channel region and having a resistance state, the first switching layer configured to switch the resistance state of the first switching layer between a high resistance state and a low resistance state; a first charge trap layer on the first channel region and configured to trap or de-trap charges according to the resistance state of the first switching layer; a first gate electrode on the first channel region and configured to apply a voltage to the first switching layer.

The semiconductor substrate may include a P-type semiconductor substrate, and the first channel region may include an N-type well.

The non-volatile inverter may further include a second switching layer on the second channel region, the second switching layer having a resistance state, the second switching layer being configured to switch the resistance state of the second switching layer between a high resistance state and a low resistance state, and a second charge trap layer between the second channel region and the second gate electrode, the second charge trap layer being configured to trap or de-trap charges according to the resistance state of the second switching layer.

The first switching layer may have a resistance value equal to or greater than about $1\times10^9$ ohms when the resistance state of the first switching layer is the high resistance state.

The first switching layer may include at least one of a chalcogenide-based material and a transition metal oxide.

The first switching layer may include a nano-filamentary material having nano-filaments, the first switching layer being configured to switch to a low resistance state based on the nano-filaments.

The nano-filamentary material may include TiOx.

The first switching layer may include a P-N diode.

The first transistor may include a gate insulating layer, the gate insulating layer having a tunneling voltage; and the P-N diode may have a breakdown voltage smaller than the tunneling voltage.

The non-volatile inverter may further include an input electrode configured to connect the first gate electrode to the second gate electrode the input electrode further configured apply an input voltage to the first gate electrode and the second gate electrode.

The non-volatile inverter may further include: a first electrode on the first drain region; a second electrode on both the first source region and the second drain region; and a third electrode on the second source region.

The non-volatile inverter may further include a passivation layer covering an upper portion of the semiconductor substrate, wherein the first electrode extends through the passivation layer and is electrically coupled to the first drain region through the passivation layer, the third electrode extends through the passivation layer and is electrically coupled to the second source region through the passivation layer, the input electrode extends through the passivation layer and is electrically coupled to the first and second gate electrodes through the passivation layer, and the second electrode extends through the passivation layer and is electrically coupled to the first source region and the second drain region through the passivation layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
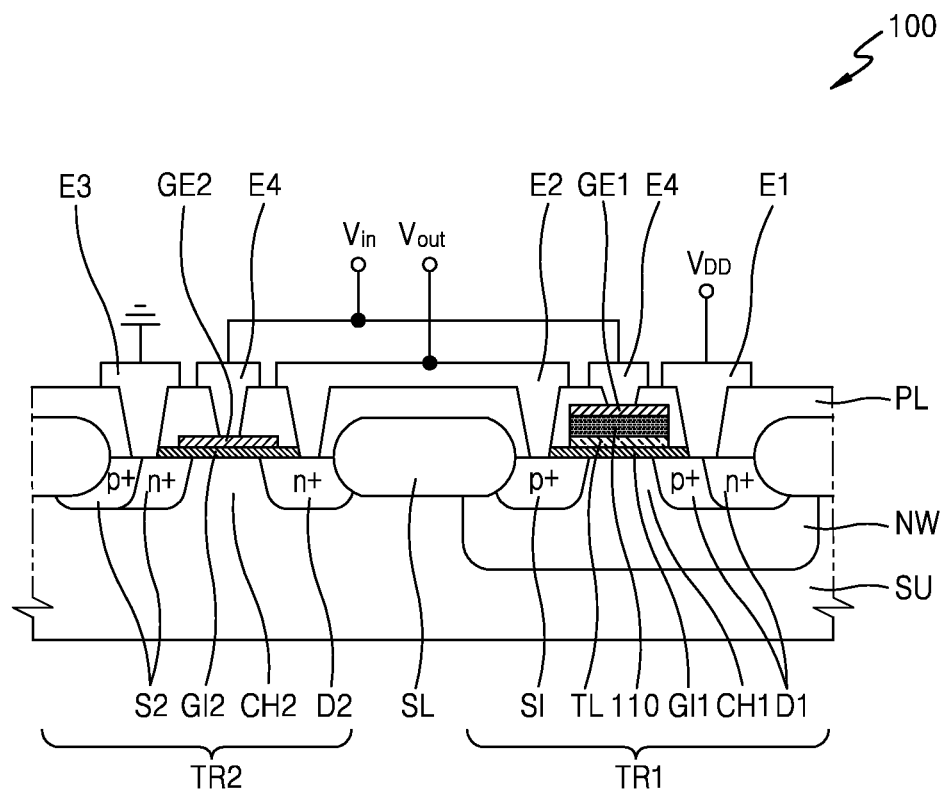
FIG. 1 is a schematic cross-sectional view of a non-volatile inverter according to some example embodiments.

As the inventive concepts allows for various changes and numerous embodiments, particular embodiments will be illustrated in the drawings and described in detail in the written description. In this regard, the present exemplary embodiments may have different forms and should not be construed as being limited to the descriptions set forth herein. Accordingly, the exemplary embodiments are merely described below, by referring to the figures, to explain aspects.

Hereinafter, the inventive concepts will be described in detail by explaining preferred embodiments of the inventive concepts with reference to the attached drawings. Like reference numerals in the drawings denote like elements.

While such terms as "first," "second," etc., may be used to describe various components elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-sectional view of a non-volatile inverter 100 according to some example embodiments.

Referring to FIG. 1, the non-volatile inverter 100 may include a first transistor TR1 and a second transistor TR2 that are connected to each other. The first transistor TR1 may include a first gate electrode GE1, a first electrode E1, and a second electrode E2. The second transistor TR2 may include a second gate electrode GE2 and a third electrode E3 and may share the second electrode E2 with the first transistor TR1.

The first transistor TR1 may include a first drain region D1, a first source region S1, and a first channel region CH1. The first channel region CH1 is between the first drain region D1 and the first source region S1.

The second transistor TR2 may include a second drain region D2, a second source region S2, and a second channel region CH2. The second channel region CH2 is between the second drain region D2 and the second source region S2.

The first drain region D1, the first source region S1, the first channel region CH1, the second drain region D2, the second source region S2, and the second channel region CH2 may be formed on a semiconductor substrate SU.

The semiconductor substrate SU may be a P-type semiconductor substrate. The semiconductor substrate SU may be formed by injecting a P-type dopant into a silicon substrate.

An N-type well NW may be formed in a region of the semiconductor substrate SU. The first drain region D1 and the first source region S1 may be formed by doping a dopant that changes into charge carriers with a high concentration. The first transistor TR1 may be a P-channel transistor using a P-type dopant as carriers. The first drain region D1 may include a P-type region and an N-type region. As shown in FIG. 1, when a diode structure is formed, an electric current may be forced to flow only in a direction from the first drain region D1 to the first channel region CH1, that is, reverse flow of the electric current may be prevented.

An N-type dopant that changes into charge carriers is doped with a high concentration in another region of the semiconductor substrate SU so as to form the second drain region D2 and the second source region S2. The second transistor TR2 may be an N-channel transistor using the N-type dopant as the carriers. The second source region S2 may include a structure in which a P-type region and an N-type region are adjacent to each other, like the first drain region D1.

A first gate insulating layer GI1, a charge trap layer TL, a first switching layer 110, and the first gate electrode GE1 may be disposed on the first channel region CH1. A second gate insulating layer GI2 and the second gate electrode GE may be formed on the second channel region CH2.

The first and second gate insulating layers GI1 and GI2 may include an insulating material such as SiO2, SiNx, AlN, Al2O3, HfO2, and ZrO2.

The charge trap layer TL traps charges introduced from the first gate electrode GE1 through the first switching layer 110 therein, and then, executes a program. The charge trap layer TL may be referred to as a floating gate as well. The charge trap layer TL may include a nano-dot material or a silicon nitride layer ($Si_xN_y$), and moreover, may include one of a high-k material having a greater dielectric constant than SiO2, polycrystalline silicon, and amorphous polysilicon material. Also, the charge trap layer TL may include a metal such as tungsten, molybdenum, cobalt, nickel, platinum, rhodium, palladium, and iridium, a combination thereof, or an alloy thereof. Alternatively, the charge trap layer TL may include a semiconductor material such as silicon, germanium, a mixture of silicon and germanium, a group III-V compound (combination of Al, Ga, and In of a group III and P, As, and Sb of a group V), or a group II-VI compound (combination of Zn, Cd, and Hg of a group 11 and O, S, Se, and Te of a group VI). Alternatively, the charge trap layer TL may include an insulating material having a high density for trapping charges, such as aluminum oxide (Al2O3), hafnium oxide (HfO), hafnium aluminum oxide (HfAlO), and hafnium silicon oxide (HfSiO).

The first switching layer 110 may have a resistance state. The first switching layer 110 may switch the resistance state between a high resistance state and a low resistance state. The first switching layer 110 may have a resistance value that varies with an applied voltage. According to some example embodiments, the first switching layer 110 may include a material that is changed to a low resistance state if and/or when a voltage of a desired (or, alternatively, predetermined) value or greater is applied thereto.

The first switching layer 110 may include a chalcogenide-based material or a transition metal oxide. The chalcogenide-based material may include, for example, at least one of a transition metal selected from Mo, W, Nb, V, Ta, Ti, Zr, Hf, Tc, and Re and one chalcogen atom selected from S, Se, and Te. The transition metal oxide may include, for example, at least one of Ti oxide, Ta oxide, Ni oxide, Zn oxide, W oxide, Co oxide, Nb oxide, TiNi oxide, LiNi oxide, InZn oxide, V oxide, SrZr oxide, SrTi oxide, Cr oxide, Fe oxide, Cu oxide, Hf oxide, Zr oxide, Al oxide, and mixtures thereof.

The above materials may be referred to as threshold voltage switching material. A threshold voltage switching material is in a low resistance state when a voltage greater than a threshold voltage is applied thereto, whereas maintaining a high resistance state at a normal state, and then, returns to the high resistance state when the applied voltage is removed. The first switching layer 110 including the threshold voltage switching material may block movement of charges between the first gate electrode GE1 and the charge trap layer TL in a high resistance state wherein no voltage is applied thereto, and allows the charges to move between the first gate electrode GE1 and the charge trap layer TL in a low resistance state wherein a voltage equal to or greater than the threshold voltage is applied thereto.

The first switching layer 110 may include a nano-filamentary material configured to switch to a low resistance state based on nano-filaments. A nano-filamentary material may be a material in which nano-filaments that are conductive are formed when a voltage of a certain value is applied thereto. The nano-filamentary material may include, for example, TiOx. It may be considered that a state in which the nano-filaments are formed is a low resistance state, and a state in which the nano-filaments are not formed is a high resistance state. The number or shapes of the nano-filaments generating the low resistance state may vary depending on a type of the nano-filamentary material, and accordingly, resistive behavior may vary. The resistance variation due to the nano-filamentary material may be tuned according to the number, shapes, and locations of the nano-filaments. When the first switching layer 110 adopts the nano-filamentary material, a time period of switching resistance may be very short, for example, about nano-seconds.

The first gate electrode GE1 may be formed on the first switching layer 110 to control the resistance state of the first switching layer 110.

The first switching layer 110 may have a leakage current characteristic similar to that of the first gate insulating layer GI1. When a voltage applied to the non-volatile inverter 100 is distributed to the first switching layer 110, the charge trap layer TL, and the first gate insulating layer GI1, a desired (or, alternatively) predetermined level or greater voltage may be applied to the first switching layer 110, and to do this, a resistance value of the first switching layer 110 in a high resistance state may be about $1\times10^9$ ohms or greater.

The first electrode E1 may be formed on the first drain region D1. The first electrode E1 electrically contacts the first drain region D1, and may be referred to as a drain electrode. The second electrode E2 may be formed on the first source region S1 and the second drain region D2 to electrically connect the first source region S1 to the second drain region D2. The second electrode E2 is electrically connected to an output terminal to output an output voltage Vout. The third electrode E3 may be formed on the second source region S2. The third electrode E3 electrically contacts the second source region S2, and may be referred to as a source electrode.

An isolation layer SL may be formed between the first and second transistors TR1 and TR2. The isolation layer SL may be provided to prevent interference between a plurality of devices formed on one substrate. The isolation layer SL may include silicon oxide (SiO2). The isolation layer SL may be formed based on oxidizing a region of the semiconductor substrate SU including a silicon material.

The first gate electrode GE1 and the second gate electrode GE2 may be connected to each other. For example, the first and second gate electrodes GE1 and GE2 may be connected to an input line including an input terminal to receive an input voltage Vin. To do this, an input electrode E4 may be further provided to connect the first gate electrode GE1 to the second gate electrode GE2.

A passivation layer PL may be formed on the semiconductor substrate SU. The passivation layer PL may entirely cover the first and second gate insulating layers GI1 and GI2, the first and second gate electrodes GE1 and GE2, the first switching layer 110, the charge trap layer TL, and the isolation layer SL formed on the semiconductor substrate SU. The first electrode E1 and the third electrode E3 may be disposed on the passivation layer PL to be electrically connected to the first drain region D1 and the second source region S2 through the passivation layer PL, respectively. The input electrode E4 may be disposed on the passivation layer PL to be electrically coupled to the first and second gate electrodes GE1 and GE2 by extending through the passivation layer PL. In addition, the second electrode E2 may be disposed on the passivation layer PL and may be electrically connected to the first source region S1 and the second drain region D2 by extending through the passivation layer PL.

Figure 2:
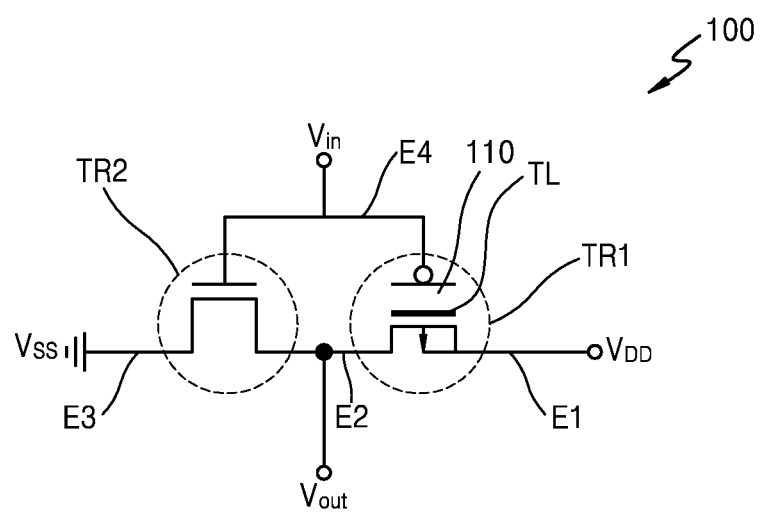
FIG. 2 is a circuit diagram of the non-volatile inverter of FIG. 1.

FIG. 2 is a circuit diagram of the non-volatile inverter 100 of FIG. 1.

The non-volatile inverter 100 includes the first transistor TR1 and the second transistor TR2 connected to each other. The first transistor TR1 may be a P-type transistor, and the second transistor TR2 may be an N-type transistor.

The first transistor TR1 may include the charge trap layer TL and the first switching layer 110 to act as a non-volatile memory device. The first switching layer 110 may include a material that may be switched to a high resistance state and a low resistance state. Charges may be trapped or de-trapped by the charge trap layer TL according to the resistance state of the first switching layer 110. Materials and functions of the first switching layer 110, and operations of the non-volatile inverter 100 according to the first switching layer 110 will be described later.

A power terminal may be connected to a drain electrode of the first transistor TR1 to apply a voltage VDD. The drain electrode of the first transistor TR1 will be referred to as the first electrode E1, as pointed out with reference to FIG. 1. The voltage VDD applied to the first electrode E1 may be a record voltage for programming the first transistor TR1, an erase voltage for erasing a recording state, or a read voltage for reading the recording state.

The source electrode of the first transistor TR1 is connected to the drain electrode of the second transistor TR2. An electrode formed by the source electrode of the first transistor TR1 and the drain electrode of the second transistor TR2 may be referred to as the second electrode E2, as defined with reference to FIG. 1. An output line having an output terminal may be branched from the second electrode E2. The output voltage $V_{OUT}$ may be output from the output terminal.

The source electrode of the second transistor TR2 may be connected to a terminal representing a voltage VSS. The source electrode of the second transistor TR2 may be referred to as the third electrode E3, as defined with reference to FIG. 1. The third electrode E3 may be grounded.

The first and second gate electrodes GE1 and GE2 may be connected to each other via a connecting line so that the input voltage Vin from the input terminal may be input thereto. An electrode connecting the first and second gate electrodes GE1 and GE2 will be referred to as an input electrode E4.

In the non-volatile inverter 100, on/off states of the first and second transistors TR1 and TR2 may be controlled and the output voltage Vout may be controlled according to the input voltage Vin applied via the input electrode E4 and the voltage VDD applied to the first electrode E1.

Figure 3:
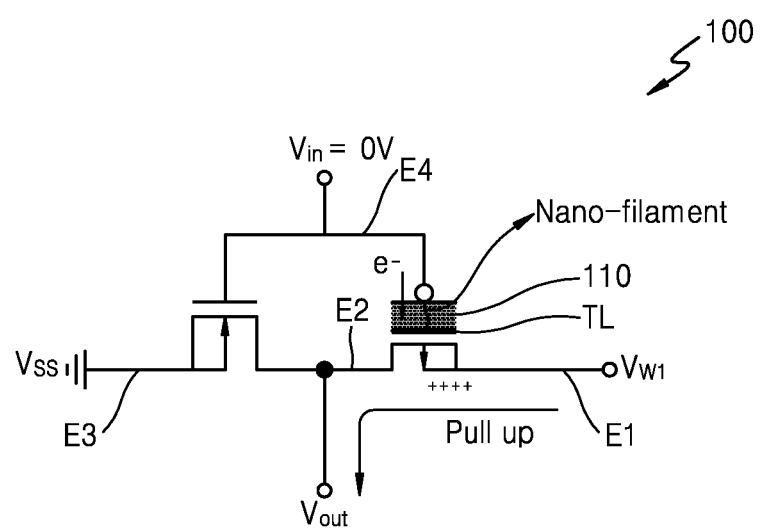
FIG. 3 is a circuit diagram illustrating a write operation performed in a pull-up mode of the non-volatile inverter of FIG. 1.

FIG. 3 is a circuit diagram illustrating a write operation performed in a pull-up mode of the non-volatile inverter 100 of FIG. 1.

The pull-up mode is a mode in which the output voltage Vout output from the output terminal is greater than the input voltage Vin applied to the input terminal, that is, in the pull-up mode, the channel of the first transistor TR1 is turned on and the channel of the second transistor TR2 is turned off. The input voltage Vin is set as 0 to turn off the channel of the second transistor TR2, and a record voltage Vw1 by which the channel of the first transistor TR1 may be turned on is applied to the first electrode E1.

Figure 4:
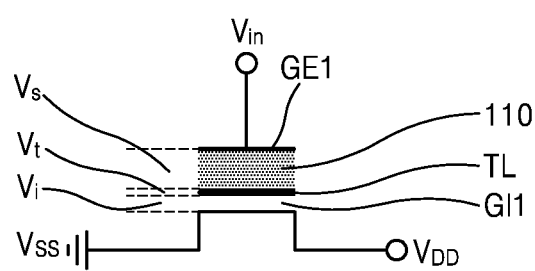
FIG. 4 is a diagram showing a difference between a write voltage and an input voltage applied to the non-volatile inverter of FIG. 1 assigned to each layer of a memory device.

FIG. 4 shows distribution of a difference between the voltage VDD applied to the first electrode E1 and the input voltage Vin applied to the input terminal E4 of the non-volatile inverter 100 of FIG. 1 to each of layers forming the memory device of the first transistor TR1.

In FIG. 4, Vs, Vt, and Vi denote voltages between opposite terminals of the first switching layer 110, the charge trap layer TL, and the first gate insulating layer GI1, respectively.

The above voltage distribution is made according to a voltage distribution rule according to the resistance value of each layer. When the voltage $V_s$ determined as above is greater than a threshold voltage $V_{sc}$ for switching to the low resistance state, that is, the voltage $V_s$ satisfies following condition, the first switching layer 110 is switched to the low resistance state.

$$V_s > V_{sc} \quad (1)$$

Here, $V_{sc}$ is a value specific to the material included in the first switching layer 110. If the first switching layer 110 includes a threshold voltage switching material, Vsc may denote a threshold voltage, and if the first switching layer 110 includes a nano-filamentary material, Vsc may denote a voltage at which the nano-filaments are generated.

In above Condition (1), charges may move from the first gate electrode GE1 to the charge trap layer TL, or from the charge trap layer TL to the first gate electrode GE1.

In order to turn on the channel of the first transistor TR1 that is the P-type transistor, following condition (2) has to be satisfied with above condition (1).

$$V_{DD} - V_{in} > V_s + V_t + V_i \quad (2)$$

Referring back to FIG. 3, a write voltage $V_{w1}$ satisfies following conditions, with reference to conditions (1) and (2).

$$V_{w1} > V_s + V_t + V_i \quad (3)$$

$$V_s > V_{sc} \quad (4)$$

When above conditions (3) and (4) are satisfied, the first switching layer 110 is switched to the low resistance state, the channel of the first transistor TR1 is turned on, and the output voltage $V_{out}$ is equal to the write voltage $V_{w1}$. In addition, electrons are introduced into the charge trap layer TL via the first switching layer 110 that is in the low resistance state. After filling the charge trap layer TL with the electrons, application of the write voltage $V_{w1}$ is terminated, and then, the first switching layer 110 is switched from the low resistance state to the high resistance state so that the electrons that have moved to the charge trap layer TL are trapped in the charge trap layer TL and the channel of the first transistor TR1 is charged with positive charges.

As described above, an operation of programming "1" is executed for charging the channel by trapping charges in the charge trap layer TL while pulling up the input voltage Vin to the output voltage Vw1 that is greater than the input voltage Vin.

Figure 5:
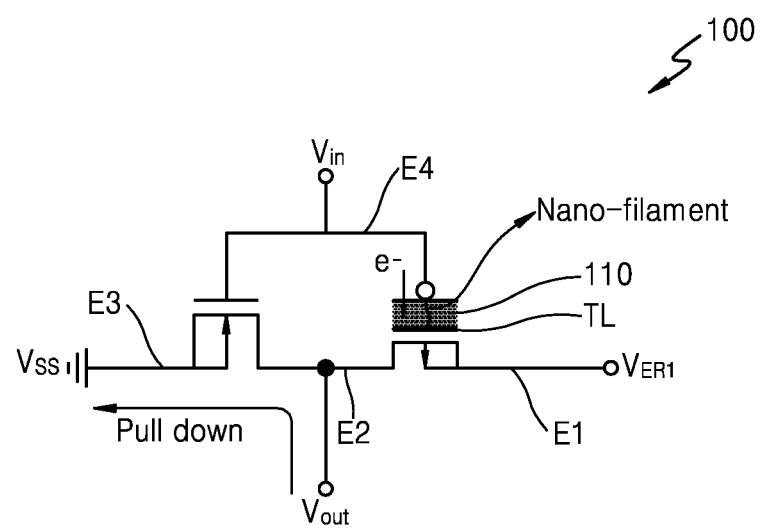
FIG. 5 is a circuit diagram illustrating an erase operation performed in a pull-down mode of the non-volatile inverter of FIG. 1.

FIG. 5 is a circuit diagram illustrating an erase operation performed in a pull-down mode of the non-volatile inverter 100 of FIG. 1.

The pull-down mode is a mode in which the output voltage Vout output from the output terminal is less than the input voltage Vin applied to the input terminal, and the channel of the first transistor TR1 is turned off and the channel of the second transistor TR2 is turned on. The input voltage Vin is increased to be greater than 0 to turn on the channel of the second transistor TR2, and an erase voltage VE1 by which the channel of the first transistor TR1 may be turned off is applied to the first electrode E1.

The erase voltage $V_{E1}$ applied to the first electrode E1 satisfies following conditions.

$$V_{in} - V_{E1} > V_s + V_t + V_i \quad (5)$$

$$V_s > V_{sc} \quad (6)$$

When the erase voltage $V_{E1}$ and the input voltage $V_{in}$ satisfying the above conditions (5) and (6) are applied to the first electrode E1 and the input electrode E4, the second transistor TR2 is turned on and the output voltage Vout becomes 0. The first switching layer 110 is switched to the low resistance state, and thus, the electrons trapped in the charge trap layer TL are discharged through the first switching layer 110. After de-trapping the electrons in the charge trap layer TL, applying of the erase voltage VE1 is terminated, and then, the first switching layer 110 is switched from the low resistance state to the high resistance state so that the de-trapping state of the charge trap layer TL is maintained and the channel of the first transistor TR1 becomes an uncharged state.

As described in the above processes, an operation of programming "0", that is, an erasing operation, is executed to de-trapping the charges in the charge trap layer TL and uncharged the channel, while pulling down the input voltage Vin to the output voltage that is lower than the input voltage, that is, 0.

Figure 6:
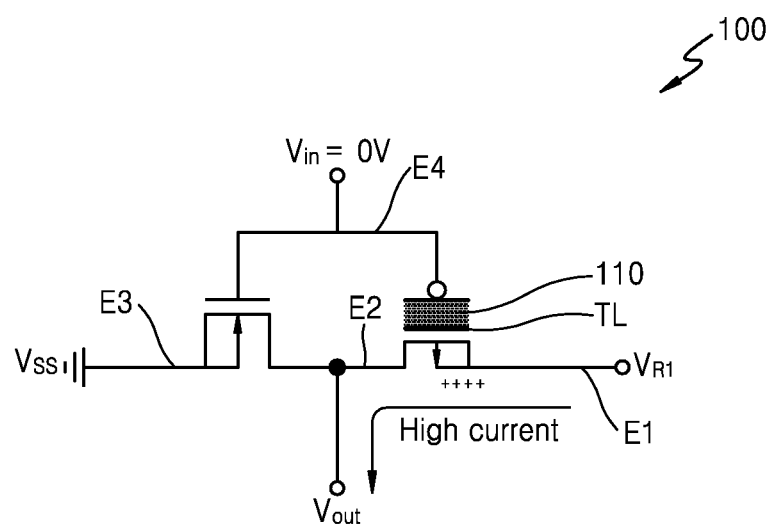
FIG. 6 is a circuit diagram illustrating an operation of reading a write state "1" of the non-volatile inverter of FIG. 1.

FIG. 6 is a circuit diagram illustrating an operation of reading a write state, that is, "1", of the non-volatile inverter 100 of FIG. 1.

A reading operation is to read a charged state of the channel of the first transistor TR1, and a voltage of 0 is applied to the input electrode E4 and a read voltage VR1 is applied to the first electrode E1. The read voltage VR1 is less than the write voltage Vw1 during the programming illustrated in FIG. 3. In addition, a voltage distributed to the first switching layer 110 from the read voltage VR1 is less than the threshold voltage Vsc. Under this condition, the first switching layer 110 maintains the high resistance state, that is, the charge trapped state in the charge trap layer TL and the charged state of the channel of the first transistor TR1 are maintained. Since the first transistor TR1 is charged, an electric current flows toward the output terminal along the charged channel. Accordingly, the write status "1" may be read.

Figure 7:
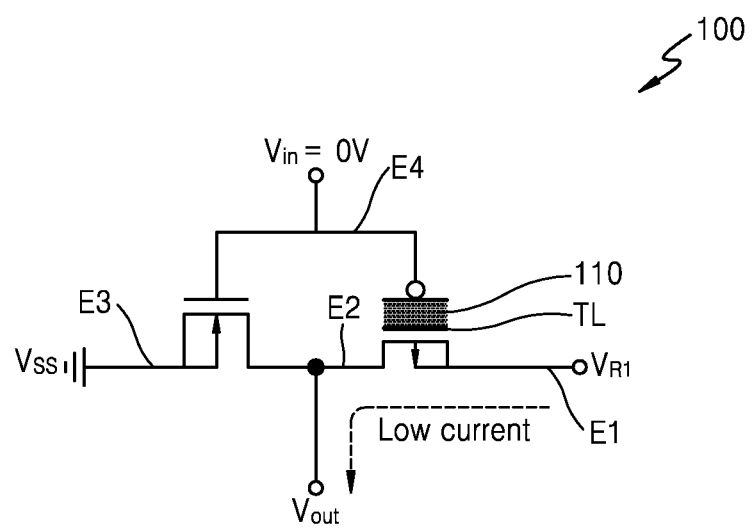
FIG. 7 is a circuit diagram illustrating an operation of reading a write state "0" of the non-volatile inverter of FIG. 1.

FIG. 7 is a circuit diagram illustrating an operation of reading a write state "0" of the non-volatile inverter 100 of FIG. 1.

When the above read voltage VR1 and the input voltage Vin are respectively applied to the first electrode E1 and the input electrode E4 in a state where the channel of the first transistor TR1 is uncharged, the electric current does not flow toward the output terminal or an electric current smaller than that of FIG. 6, in which the channel of the first transistor TR1 is charged, flows toward the output terminal. Accordingly, the write state "0" may be read.

In the non-volatile inverter 100, a memory function and a logic function are integrated. That is, an inverter that is a base of the logic includes a non-volatile memory device therein, and thus, the last state after the inverter operation is maintained.

Hereinafter, other examples of the non-volatile inverter performing the above functions will be described below.

Figure 8:
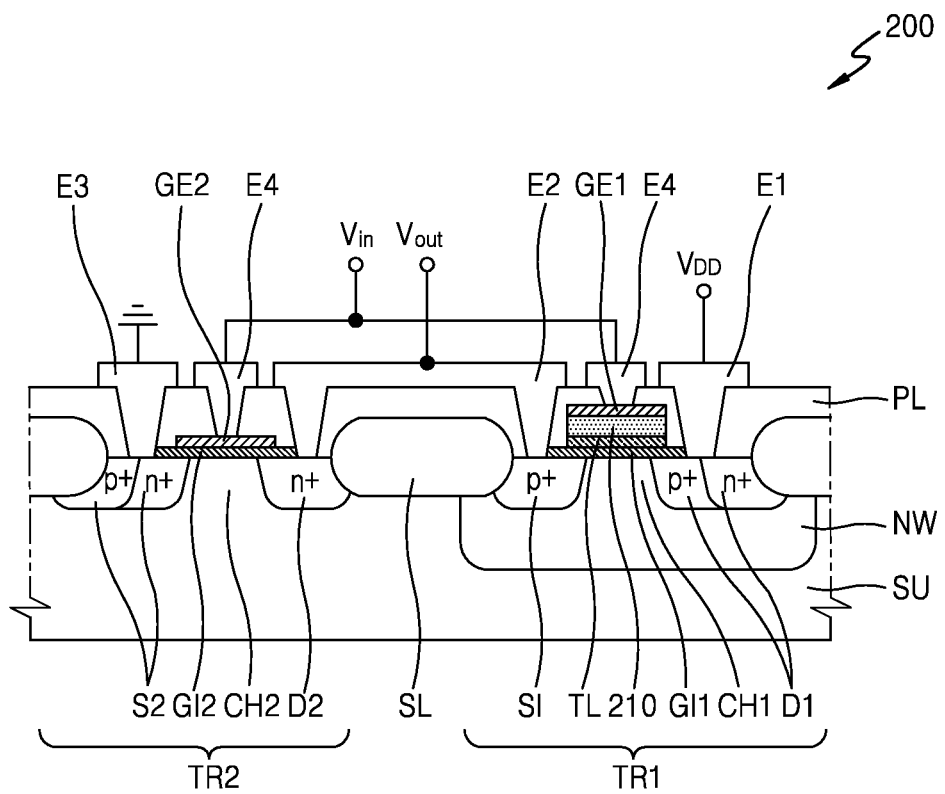
FIG. 8 is a schematic cross-sectional view of a non-volatile inverter according to some example embodiments.
Figure 9:
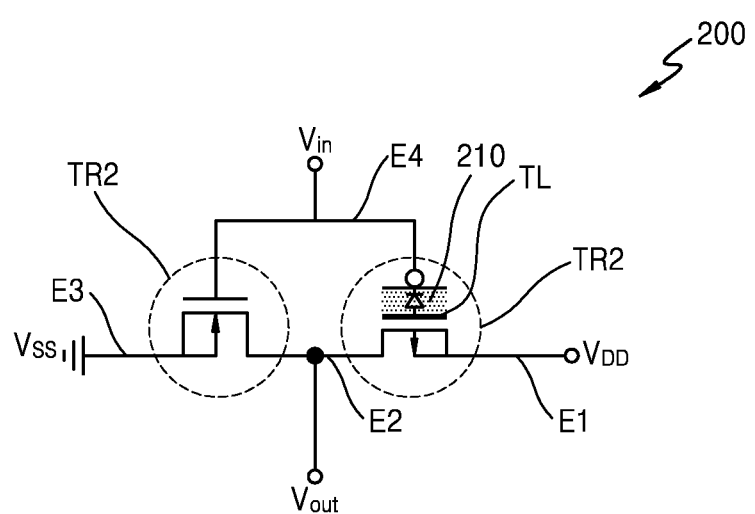
FIG. 9 is a circuit diagram of the non-volatile inverter of FIG. 8.

FIG. 8 is a schematic cross-sectional view of a non-volatile inverter 200 according to some example embodiments, and FIG. 9 is a circuit diagram of the non-volatile inverter 200 of FIG. 8.

The non-volatile inverter 200 of the present exemplary embodiment is different from the non-volatile inverter 100 in view of a configuration of a first switching layer 210. Other elements are the same as those of the non-volatile inverter 100, and descriptions thereof will be omitted.

The non-volatile inverter 200 adopts a P-N diode in the first switching layer 210 of the first transistor TR1 operating as a memory device.

The P-N diode may show a low resistance state under a forward bias voltage. Under a reverse bias voltage, the P-N diode shows the low resistance state when the reverse bias voltage is greater than a breakdown voltage VB, and shows a high resistance state when the reverse bias voltage is equal to or less than the breakdown voltage VB. The breakdown voltage VB may be a Zener breakdown voltage or an avalanche breakdown voltage according to a material forming the P-N diode and characteristics thereof.

Figure 10:
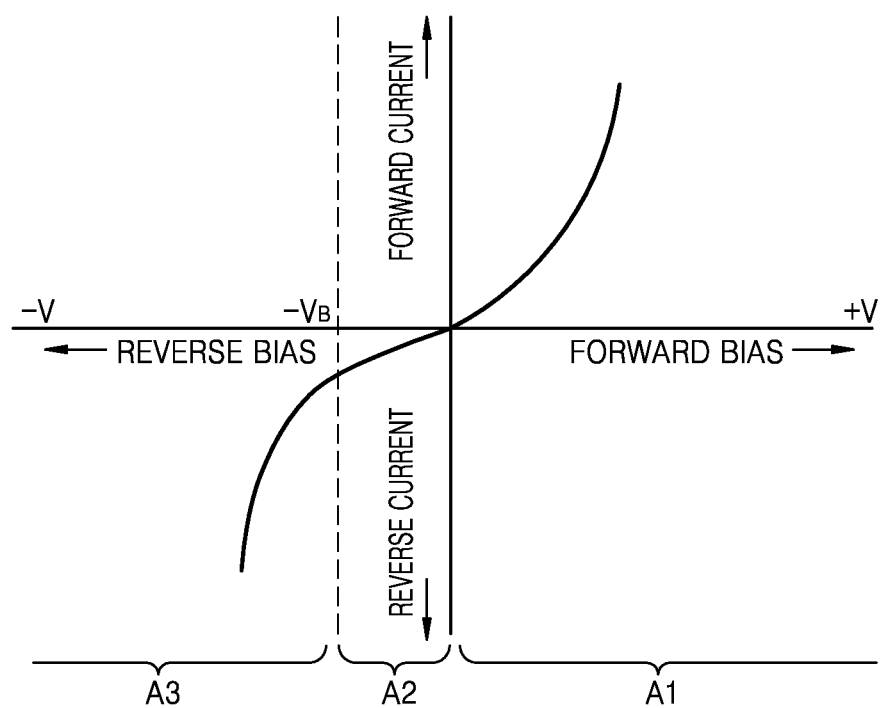
FIG. 10 is a graph illustrating that a P-N diode adopted as a memory device of the non-volatile inverter of FIG. 8 switching to a high resistance state or a low resistance state according to an applied voltage.

FIG. 10 is a graph illustrating that the P-N diode adopted as the memory device of the non-volatile inverter 200 of FIG. 8 is switched to the high resistance state and the low resistance state according to a voltage applied thereto.

In a forward bias section A1 and a section A3 in which the reverse bias voltage is greater than the breakdown voltage VB in the reverse bias section, the first switching layer 210 operates in the low resistance state, and in a section A2 in which the reverse bias voltage is less than the breakdown voltage VB, the first switching layer 210 operates in the high resistance state.

By adopting the P-N diode having the above property as the first switching layer 210, the write voltage applied to the first electrode E1 in the programming stage for trapping the charges in the charge trap layer TL may be less than the write voltage applied to the non-volatile inverter 100 according to the previous exemplary embodiment.

In addition, the breakdown voltage VB of the P-N diode adopted as the first switching layer 210 may be less than a tunneling voltage of the first gate insulating layer GI1. Also, the P-N diode adopted as the first switching layer 210 may be a material having the breakdown voltage by which the trapped charges may be preserved stably. The breakdown voltage VB may range, for example, from 1V to 2V.

Figure 11:
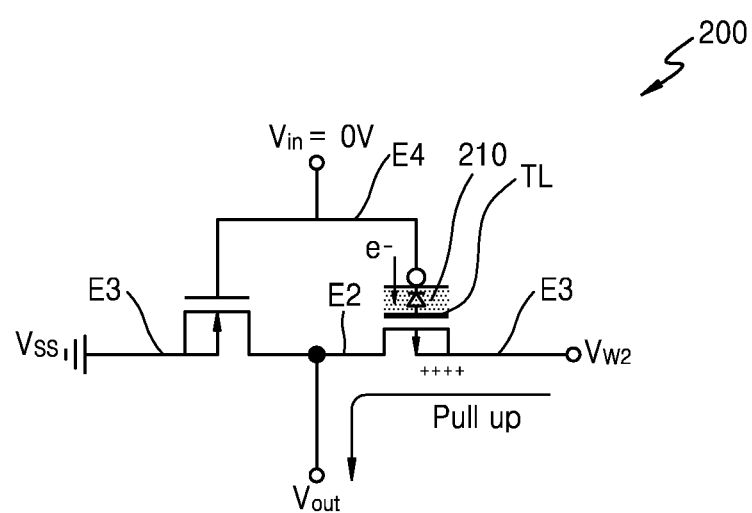
FIG. 11 is a circuit diagram illustrating a write operation performed in a pull-up mode of the non-volatile inverter of FIG. 8.

FIG. 11 is a circuit diagram illustrating a write operation performed in a pull-up mode of the non-volatile inverter 200 of FIG. 8.

In the pull-up mode, an output voltage Vout output from the output terminal is greater than an input voltage Vin applied to the input terminal, and the channel of the first transistor TR1 is turned on and the channel of the second transistor TR2 is turned off. In the pull-up mode, the input voltage Vin is set as 0 to turn off the channel of the second transistor TR2, and a write voltage Vw2 by which the channel of the first transistor TR1 may be turned on is applied to the first electrode E1.

As illustrated with reference to FIG. 4 and the above condition (2), when the input voltage $V_{in}$ is 0, the write voltage $V_{w2}$ satisfies following condition.

$$V_{w2} > V_s + V_t + V_i \quad (7)$$

Here, $V_s$, Vt, and Vi respectively denote voltages between opposite terminals of the first switching layer 210, the charge trap layer TL, and the first gate insulating layer GI1.

When the forward bias voltage is applied to the first switching layer 210, the voltage Vs has a very small value that does not need to satisfy the condition (6) (Vs>Vsc) since the first switching layer 210 is in the low resistance state, as shown in the graph of FIG. 10.

Therefore, the write voltage Vw2 is less than the write voltage Vw1 applied to the non-volatile inverter 100 according to the previous exemplary embodiment.

In the above condition, the first switching layer 210 is in the low resistance state, the channel of the first transistor TR1 is turned on, and the output voltage Vout is equal to the write voltage Vw2. In addition, electrons are introduced into the charge trap layer TL via the first switching layer 210 in the low resistance state. After the electrons are filled in the charge trap layer TL, the applying of the write voltage Vw2 is removed. Since the electric current does not flow in a reverse direction of the P-N diode unless the reverse bias voltage is applied thereto, the electrons moved to the charge trap layer TL are trapped in the charge trap layer TL and the channel of the first transistor TR1 is charged with positive charges.

As illustrated in the above processes, a programming "1" operation is executed to trap the charges in the charge trap layer TL and charge the channel, while pulling up the input voltage Vin to the output voltage Vout of the write voltage Vw2 that is greater than the input voltage Vin.

Figure 12:
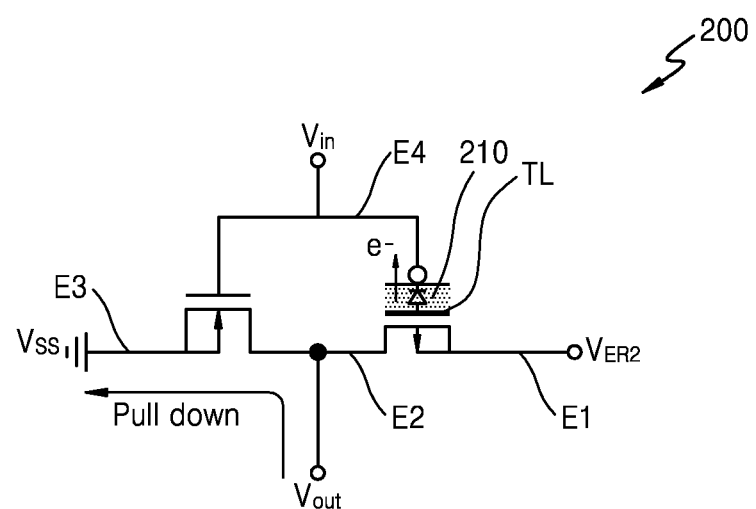
FIG. 12 is a circuit diagram illustrating an erase operation performed in a pull-down mode of the non-volatile inverter of FIG. 8.

FIG. 12 is a circuit diagram illustrating an erase operation performed in a pull-down mode of the non-volatile inverter 200 of FIG. 8.

In the pull-down mode, the output voltage Vout output from the output terminal is less than the input voltage Vin applied to the input terminal, and the channel of the first transistor TR1 is turned off and the channel of the second transistor TR2 is turned on. The input voltage Vin is set to be greater than 0 in order to turn on the channel of the second transistor TR2, and an erase voltage VER2 by which the channel of the first transistor TR1 may be turned off is applied to the terminal of the first electrode E1.

The erase voltage $V_{ER2}$ applied to the first electrode E1 satisfies following conditions.

$$V_{in} - V_{ER2} > V_s + V_t + V_i \quad (8)$$

$$V_s > V_B \quad (9)$$

$V_B$ denotes a breakdown voltage of the P-N diode included in the first switching layer 210.

When the erase voltage VER2 and the input voltage Vin satisfying the above conditions (8) and (9) are applied to the first electrode E1 and the input electrode E4, the second transistor TR2 is turned on and the output voltage Vout becomes 0. Since the reverse bias voltage that is greater than the breakdown voltage VB is applied to the first switching layer 210, the first switching layer 210 switches to the low resistance state, in which the electric current flows in the reverse direction, that is, the electrons trapped in the charge trap layer TL leak through the first switching layer 210. After de-trapping the electrons in the charge trap layer TL, the erase voltage VER2 is removed, and then, the first switching layer 210 switches to the high resistance state so that the de-trapping state of the charge trap layer TL is maintained and the channel of the first transistor TR1 is in an uncharged state.

As described in the above processes, a programming "0" operation, that is, an erase operation, is performed to de-trap the charges in the charge trap layer TL and uncharged the channel by pulling down the input voltage Vin to the output voltage Vout of 0 that is lower than the input voltage Vin.

Figure 13:
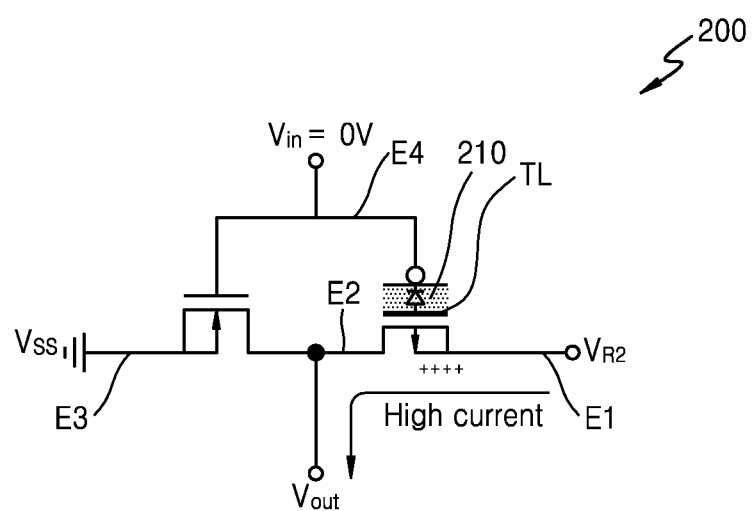
FIG. 13 is a circuit diagram illustrating an operation of reading a write state "1" of the non-volatile inverter of FIG. 8.

FIG. 13 is a circuit diagram illustrating an operation of reading a write state "1" of the non-volatile inverter 200 of FIG. 8.

The read operation is to read a charged state of the channel in the first transistor TR1, and 0 V is applied to the input electrode E4 and a read voltage VR2 is applied to the first electrode E1. The read voltage VR2 is less than the write voltage VW2 in the programming operation of FIG. 11. The write voltage VW2 is less than the write voltage VW1 of FIG. 3, and thus, the read voltage VR2 may be less than the read voltage VR1 of FIG. 5.

In addition, since the first switching layer 210 may switch to the low resistance state even with a small forward bias voltage applied thereto, negative charges trapped in the charge trap layer TL may be discharged through the first switching layer 210 while resulting in a reduction of positive charges in the channel. Therefore, the read voltage VR2 is set as small as possible for reducing the above phenomenon. Under this condition, since the channel of the first transistor TR1 is charged, the electric current flows toward the output terminal along the charged channel. Accordingly, the write state "1" may be read.

Figure 14:
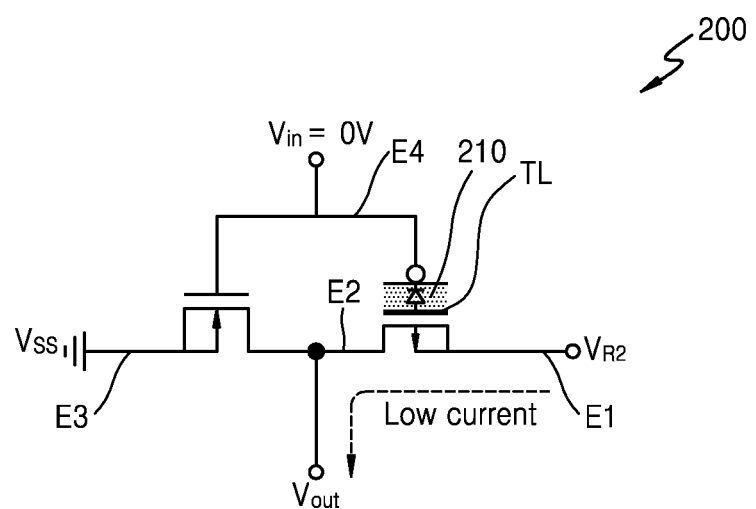
FIG. 14 is a circuit diagram illustrating an operation of reading a write state "0" of the non-volatile inverter of FIG. 8.

FIG. 14 is a circuit diagram illustrating an operation of reading a write state "0" of the non-volatile inverter 200 of FIG. 8.

When the channel of the first transistor TR1 is in the uncharged state, the write voltage VR2 as in the description of FIG. 13 and the input voltage Vin are applied to the first electrode E1 and the input electrode E4, and then, the electric current may not flow toward the output terminal or a smaller amount of electric current flows toward the output terminal than that of the case illustrated in FIG. 14 in which the channel is in the charged state. Accordingly, the write state "0" may be read.

Figure 15:
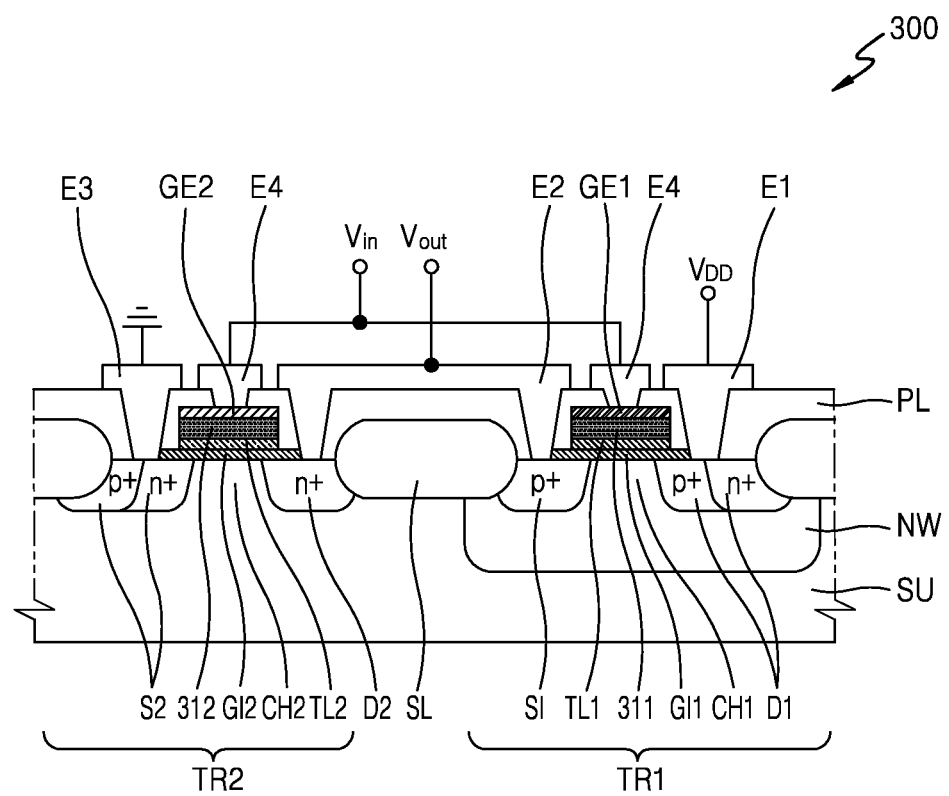
FIG. 15 is a schematic cross-sectional view of a non-volatile inverter according to some example embodiments.
Figure 16:
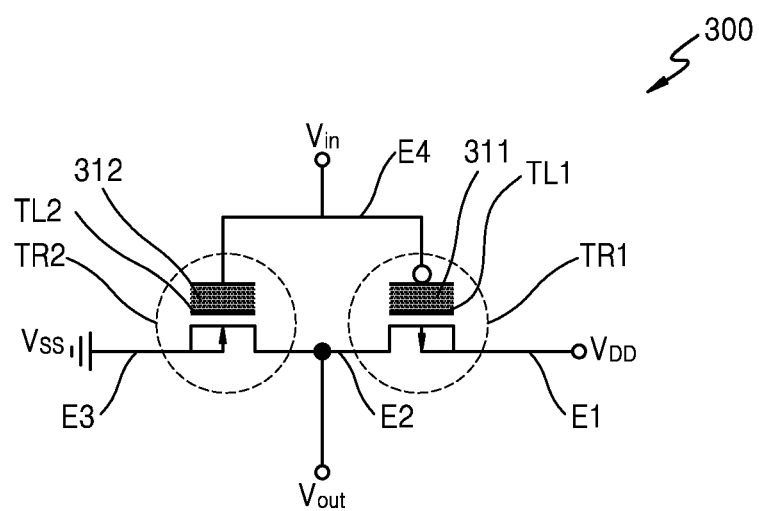
FIG. 16 is a circuit diagram of the non-volatile inverter of FIG. 15.

FIG. 15 is a schematic cross-sectional view of a non-volatile inverter 300 according to some example embodiments, and FIG. 16 is a circuit diagram of the non-volatile inverter 300 of FIG. 15.

The non-volatile inverter 300 of the present exemplary embodiment includes the first transistor TR1 and the second transistor TR2. The first transistor TR1 includes a first charge trap layer TL1 and a first switching layer 311 and the second transistor TR2 includes a second charge trap layer TL2 and a second switching layer 312. The other elements are the same as those of the non-volatile inverter 100 of FIG. 1.

The first switching layer 311 and the second switching layer 312 include a material that may switch from a low resistance state to a high resistance state, similarly to the first switching layer 110 of FIG. 1. For example, the first and second switching layers 311 and 312 may include a chalcogenide-based material, transition metal oxide, or a nanofilamentary material.

Figure 17:
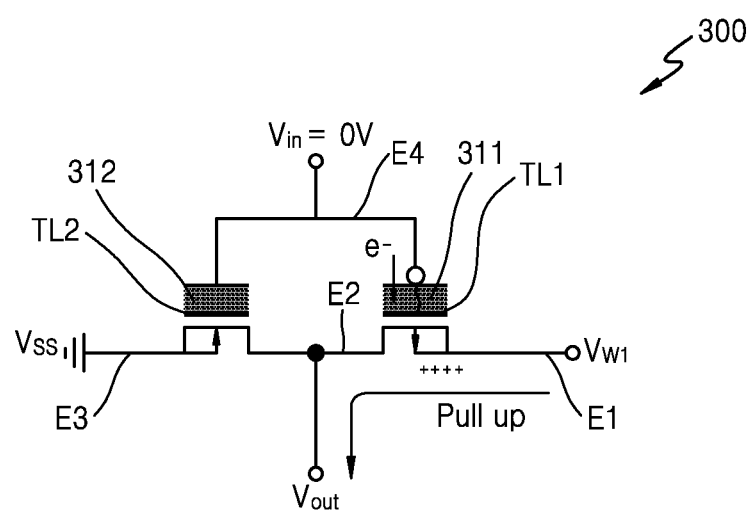
FIG. 17 is a circuit diagram illustrating a write operation performed in a pull-up mode of the non-volatile inverter of FIG. 15.

FIG. 17 is a circuit diagram illustrating a write operation performed in a pull-up mode of the non-volatile inverter 300 of FIG. 15.

The write operation on the non-volatile inverter 300 is similar to the write operation illustrated with reference to FIG. 3. When the input voltage Vin is set as 0 and the write voltage Vw1 satisfying conditions (3) and (4) is applied and then removed, charges are trapped in the first charge trap layer TL1 and the channel of the first transistor TR1 is positively charged. Since the channel of the second transistor TR2 is turned off, the second charge trap layer TL2 does not trap charges.

As such, a programming "1" operation is performed to trap charges in the first charge trap layer TL1 and charge the channel, while pulling up the input voltage Vin to the output voltage Vout of the write voltage Vw1 that is greater than the input voltage Vin.

Figure 18:
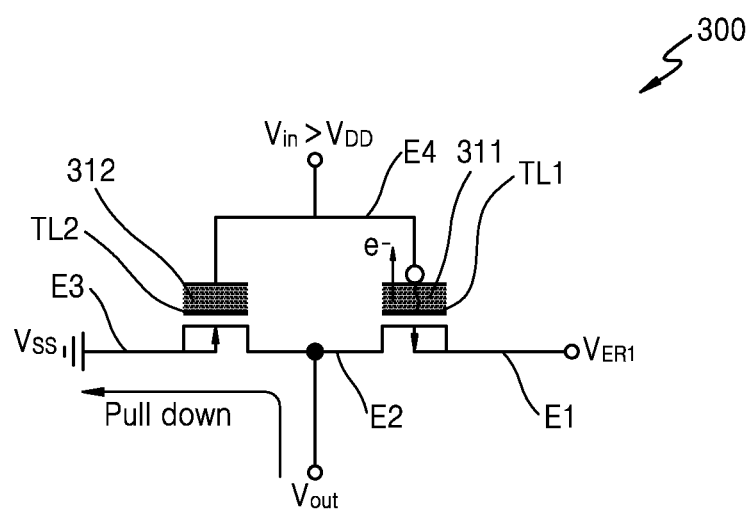
FIG. 18 is a circuit diagram illustrating an erase operation performed in a pull-down mode of the non-volatile inverter of FIG. 15.

FIG. 18 is a circuit diagram illustrating an erase operation performed in a pull-down mode of the non-volatile inverter 300 of FIG. 15.

The erase operation on the non-volatile inverter 300 is nearly similar to the erase operation illustrated with reference to FIG. 4. When the erase voltage VER1 satisfying the conditions (5) and (6) is applied, negative charges trapped in the first charge trap layer TL1 are discharged through the first switching layer 311. When the erase voltage VER1 is removed, the first switching layer 311 switches to the high resistance state, and thus, the de-trap state of the first charge trap layer TL1 is maintained and the uncharged state of the channel of the first transistor TR1 is maintained. The channel of the second transistor TR2 is turned on and the second switching layer 312 switches to the low resistance state. However, since there is no charge trapped in the second charge trap layer TL2, the transfer of charges does not occur.

As illustrated in the above processes, the programming "0" operation, that is, the erase operation, is performed to de-trap the charges in the first charge trap layer TL1 and to make the channel uncharged, while pulling down the input voltage Vin to the output voltage Vout of 0 V that is less than the input voltage.

Figure 19:
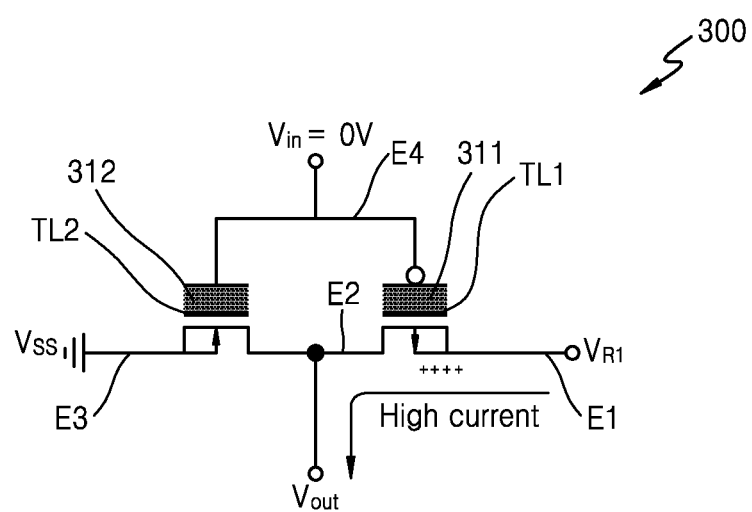
FIG. 19 is a circuit diagram illustrating an operation of reading a write state "1" of the non-volatile inverter of FIG. 15.

FIG. 19 is a circuit diagram illustrating an operation of reading a recorded state "1" of the non-volatile inverter 300 of FIG. 15.

The input voltage Vin of 0V is applied to the input electrode E4 and the read voltage VR1 is applied to the first electrode E1. A voltage distributed to the first switching layer 311 from the read voltage VR1 is less than the threshold voltage Vsc. In this state, since the channel of the first transistor TR1 is charged, the electric current flows toward the output terminal along the charged channel. Accordingly, the recorded state "1" may be read.

Figure 20:
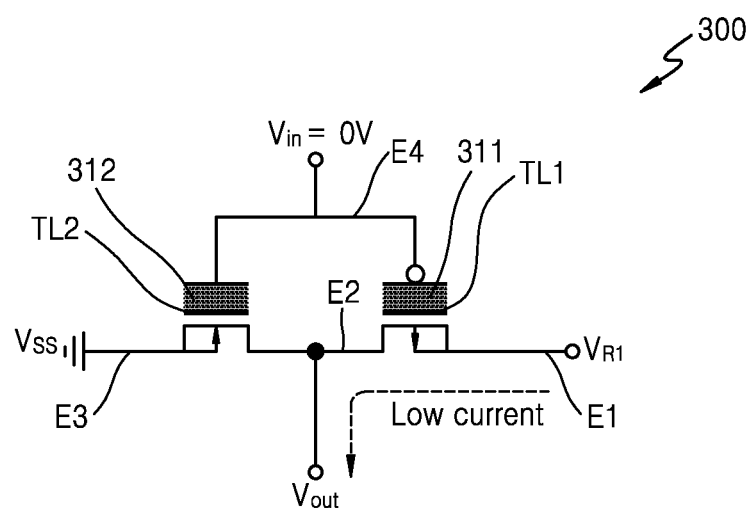
FIG. 20 is a circuit diagram illustrating an operation of reading a write state "0" of the non-volatile inverter of FIG. 15.

FIG. 20 is a circuit diagram illustrating an operation of reading a recorded state "0" of the non-volatile inverter 300 of FIG. 15.

When the channel of the first transistor TR1 is in the uncharged state, the read voltage VR1 and the input voltage Vin are applied to the first electrode E1 and the input electrode E4, and then, the electric current does not flow toward the output terminal or a smaller amount of electric current flows toward the output terminal than in the case of FIG. 19, in which the channel is in the charged state. Accordingly, the recorded state "0" may be read.

Figure 21:
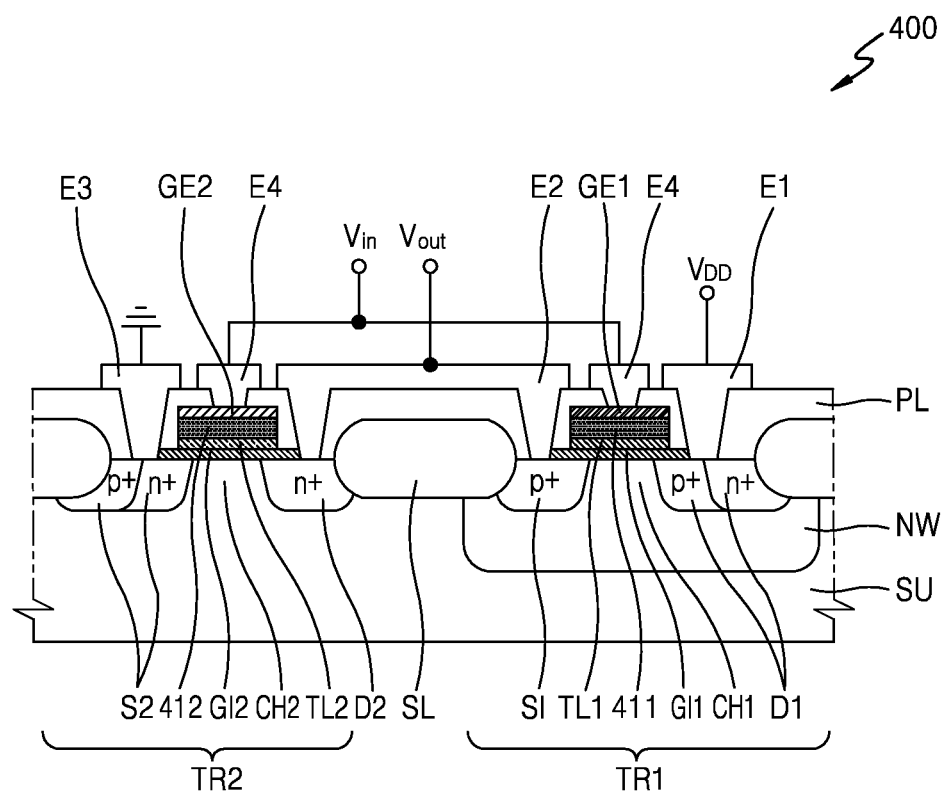
FIG. 21 is a schematic cross-sectional view of a non-volatile inverter according to some example embodiments.
Figure 22:
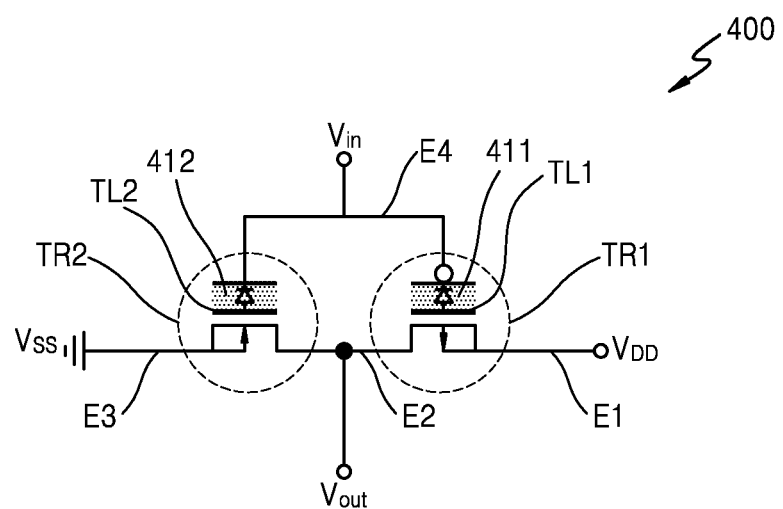
FIG. 22 is a circuit diagram of the non-volatile inverter of FIG. 21.

FIG. 21 is a schematic cross-sectional view of a non-volatile inverter 400 according to some example embodiments, and FIG. 22 is a circuit diagram of the non-volatile inverter 400 of FIG. 21.

The non-volatile inverter 400 according to the present exemplary embodiment includes the first transistor TR1 and the second transistor TR2. The first transistor TR1 includes the first charge trap layer TL1 and a first switching layer 411, and the second transistor TR2 includes the second charge trap layer TL2 and a second switching layer 412. The first switching layer 411 and the second switching layer 412 respectively include P-N diodes, and the other elements are the same as those of the non-volatile inverter 200 of FIG. 8.

Figure 23:
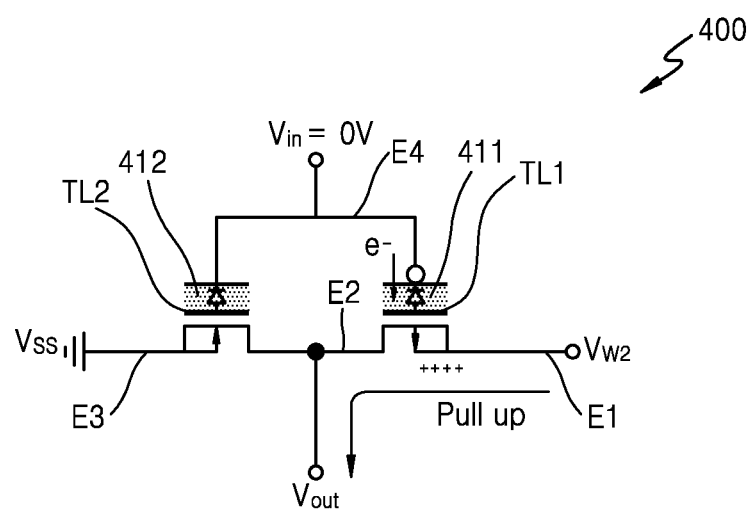
FIG. 23 is a circuit diagram illustrating a write operation performed in a pull-up mode of the non-volatile inverter of FIG. 21.

FIG. 23 is a circuit diagram illustrating a write operation performed in a pull-up mode of the non-volatile inverter 400 of FIG. 21.

The write operation on the non-volatile inverter 400 is similar to the write operation performed on the non-volatile inverter 200 illustrated with reference to FIG. 11.

The input voltage Vin is set as 0 to turn off the channel of the second transistor TR2, and the write voltage Vw2 by which the channel of the first transistor TR1 may be turned on is applied to the first electrode E1.

The write voltage Vw2 is less than the write voltage Vw1 applied to the non-volatile inverter 100, as described above with reference to FIG. 11.

When the input voltage Vin and the write voltage Vw2 are applied, the first switching layer 411 switches to the low resistance state, the channel of the first transistor TR1 is turned on, and the output voltage Vout is equal to the write voltage Vw1. In addition, electrons are introduced into the first charge trap layer TL1 via the first switching layer 411 that is in the low resistance state. After filling the electrons in the first charge trap layer TL1, the applying of the write voltage Vw2 is removed. Since the electric current does not flow in a reverse direction of the P-N diode unless the reverse bias voltage is applied thereto, the electrons moved to the first charge trap layer TL1 are trapped in the first charge trap layer TL1, and the channel of the first transistor TR1 is charged with positive charges.

Since the channel of the second transistor TR2 is turned off, the second charge trap layer TL2 does not trap charges and the channel of the second transistor TR2 is not charged.

As illustrated in the above processes, the programming "1" operation is performed to trap the charges in the first charge trap layer TL1 and to charge the channel, while pulling up the input voltage Vin to the output voltage Vout of the write voltage Vw1 that is greater than the input voltage Vin.

Figure 24:
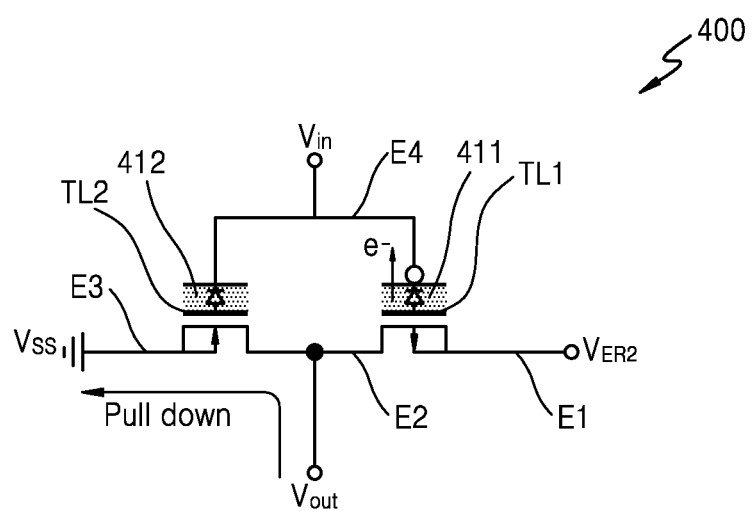
FIG. 24 is a circuit diagram illustrating an erase operation performed in a pull-down mode of the non-volatile inverter of FIG. 21.

FIG. 24 is a circuit diagram illustrating an erase operation performed in a pull-down mode of the non-volatile inverter 400 of FIG. 21.

The erase operation on the non-volatile inverter 400 is similar to the erase operation on the non-volatile inverter 200 illustrated with reference to FIG. 12.

The input voltage Vin is set to be greater than 0 so that the channel of the second transistor TR2 is turned on, and an erase voltage VER2 by which the channel of the first transistor TR1 may be turned off is applied to the terminal of the first electrode E1.

The erase voltage VER2 applied to the first electrode E1 satisfies above conditions (8) and (9), as described above with reference to FIG. 12.

When the erase VER2 and the input voltage Vin are applied respectively to the first electrode E1 and the input electrode E4, the second transistor TR2 is turned on, and the output voltage Vout becomes 0. Since the reverse bias voltage that is greater than the breakdown voltage VB is applied to the first switching layer 411, the first switching layer 411 switches to the low resistance state in which the electric current flows in the reverse direction, that is, the electrons trapped in the first charge trap layer TL1 are discharged through the first switching layer 411. After de-trapping the charges in the first charge trap layer TL1, when the applying of the erase voltage VER2 is removed, the first switching layer 411 switches to the high resistance state and the de-trap state of the first charge trap layer TL1 is maintained, and the channel of the first transistor TR1 is in the uncharged state.

The channel of the second transistor TR2 is turned on and the reverse bias voltage that is greater than the breakdown voltage is applied to the second switching layer 412, and the second switching layer 412 switches to the low resistance state. However, since there is no charge trapped in the second charge trap layer TL2, the transfer of charges does not occur.

As described in the above processes, the programming "0" operation, that is, the erase operation, is performed to de-trap the charges in the first charge trap layer TL1 and make the channel uncharged, while pulling down the input voltage Vin to a voltage of 0V that is less than the input voltage Vin.

Figure 25:
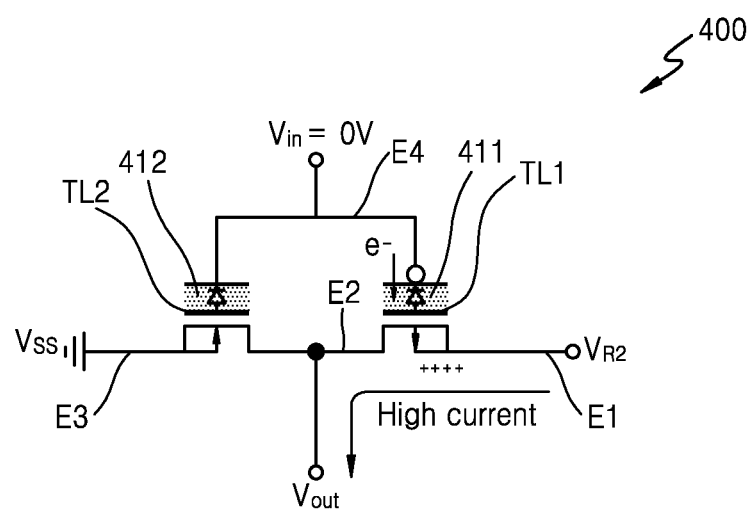
FIG. 25 is a circuit diagram illustrating an operation of reading a write state "1" of the non-volatile inverter of FIG. 21.

FIG. 25 is a circuit diagram illustrating an operation of reading a recorded state "1" of the non-volatile inverter 400 of FIG. 21.

The read operation is an operation of reading the charged state of the channel in the first transistor TR1, and 0V is applied to the input electrode E4 and a read voltage VR2 is applied to the first electrode E1. The read voltage VR2 is less than the write voltage VW2 during the programming of FIG. 23. Since the write voltage VW2 is less than the write voltage VW1 of FIG. 3, the read voltage VR2 may be also less than the read voltage VR1 of FIG. 5.

In addition, since the first switching layer 411 switches to the low resistance state even with a small forward bias voltage, negative charges trapped in the first charge trap layer TL1 may be discharged through the first switching layer 411, resulting in reduction of positive charges in the channel. Therefore, the read voltage VR2 is set as small as possible in order to reduce the above phenomenon. In this state, since the channel of the first transistor TR1 is charged, the electric current flows toward the output terminal along the charged channel. Accordingly, the recorded state "1" may be read.

Figure 26:
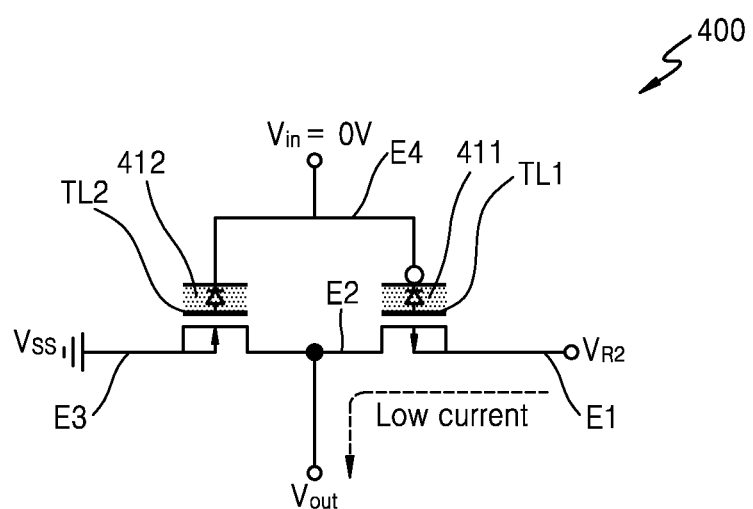
FIG. 26 is a circuit diagram illustrating an operation of reading a write state "0" of the non-volatile inverter of FIG. 21.

FIG. 26 is a circuit diagram illustrating an operation of reading a recorded state "0" of the non-volatile inverter 400 of FIG. 21.

In a state wherein the channel of the first transistor TR1 is uncharged, when the read voltage VR2 and the input voltage Vin are respectively applied to the first electrode E1 and the input electrode E4, the electric current does not flow toward the output terminal or a smaller amount of electric current flows toward the output terminal than in the case of FIG. 25, in which the channel is charged. Accordingly, the recorded state "0" may be read.

The inverter according to the above exemplary embodiments may be applied as a base element in various logic devices, for example, a NAND device, a NOR device, an encoder, a decoder, a multiplexer (MUX), a de multiplexer (DEMUX), a sense amplifier, and an oscillator.

In addition, the non-volatile inverter according to the exemplary embodiments and the logic device including the non-volatile inverter may be applied to a memory device, a liquid crystal display (LCD) device, an organic light-emitting display apparatus, various semiconductor devices, and electronic devices, in various purposes.

The non-volatile inverter may implement the memory function, together with the inverter function.

The non-volatile inverter according to the exemplary embodiments may operate faster with a lower voltage, when comparing with an inverter using the tunneling.

A memory system of high integration may be implemented in various electronic devices by using the non-volatile inverter.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A non-volatile inverter, comprising:
a first transistor, including,
   a first gate electrode,
   a first electrode,
   a second electrode,
   a first switching layer having a resistance state, the first switching layer configured to switch the resistance state of the first switching layer between a high resistance state and a low resistance state, and
   a charge trap layer configured to trap or de-trap charges according to the resistance state of the first switching layer;
a second transistor including a second gate electrode and a third electrode, the second transistor being configured to share the second electrode with the first transistor;
an input line including an input terminal, the input line being configured to connect the first gate electrode to the second gate electrode; and
an output line including an output terminal, the output line coupled to the second electrode.

2. The non-volatile inverter of claim 1, wherein,
the first transistor is a P-channel transistor, and
the second transistor is an N-channel transistor.

3. The non-volatile inverter of claim 2, wherein the second transistor includes,
a second switching layer having a resistance state, the second switching layer being configured to switch the resistance state of the second switching layer between a high resistance state and a low resistance state, and
a second charge trap layer configured to trap or de-trap charges according to the resistance state of the second switching layer.

4. The non-volatile inverter of claim 1, wherein the first switching layer has a resistance value equal to or greater than about $1 \times 10^9$ ohms when the resistance state of the first switching layer is the high resistance state.

5. The non-volatile inverter of claim 1, wherein the first switching layer includes at least one of a chalcogenide-based material and a transition metal oxide.

6. The non-volatile inverter of claim 1, wherein the first switching layer includes a nano-filamentary material having nano-filaments, the first switching layer being configured to switch to a low resistance state based on the nano-filaments.

7. The non-volatile inverter of claim 6, wherein the nano-filamentary material includes $TiO_2$.

8. The non-volatile inverter of claim 1, wherein the first switching layer includes a P-N diode.

9. The non-volatile inverter of claim 8, wherein
the first transistor includes a gate insulating layer, the gate insulating layer having a tunneling voltage; and
the P-N diode has a breakdown voltage, the breakdown voltage being smaller than the tunneling voltage.

10. The non-volatile inverter of claim 1, wherein the non-volatile inverter is configured to perform a write operation in a pull-up mode when an output voltage output from the output terminal is greater than an input voltage applied to the input terminal.

11. The non-volatile inverter of claim 10, wherein
performing the write operation includes distributing a voltage to the first switching layer when a write voltage is applied to the first electrode, and
the distributed voltage is at least equal to a switching voltage at which the first switching layer switches the resistance state of the first switching layer from the high resistance state to the low resistance state.

12. The non-volatile inverter of claim 11, wherein
the first switching layer is configured to switch the resistance state of the first switching layer from the low resistance state to the high resistance state when the write voltage is removed from the first electrode, and
switching the resistance state of the first switching layer from the low resistance state to the high resistance state includes trapping charges in the charge trap layer.

13. The non-volatile inverter of claim 12, wherein the non-volatile inverter is configured to perform a read operation such that a read voltage is applied to the first electrode, wherein the read voltage is smaller than the write voltage.

14. The non-volatile inverter of claim 13, wherein the non-volatile inverter is configured to distribute voltage from the read voltage to the first switching layer, wherein the distributed voltage is a voltage at which the first switching layer maintains the high resistance state.

15. The non-volatile inverter of claim 1, wherein the non-volatile inverter is configured to perform an erase operation in a pull-down mode when an output voltage output from the output terminal is smaller than an input voltage applied to the input terminal.

16. The non-volatile inverter of claim 15, wherein
performing the erase operation includes distributing a voltage to the first switching layer when an erase voltage is applied to the first electrode, the erase voltage being less than the input voltage, and
the distributed voltage is at least equal to a switching voltage at which the first switching layer switches the resistance state of the first switching layer from the high resistance state to the low resistance state.

17. The non-volatile inverter of claim 16, wherein
the first switching layer is configured to switch the resistance state of the first switching layer from the low resistance state to the high resistance state when the erase voltage is removed from the first electrode, and
switching the resistance state of the first switching layer from the low resistance state to the high resistance state includes maintaining a de-trap state of charges in the charge trap layer.

18. A non-volatile inverter, comprising:
a semiconductor substrate;
a first drain region and a first source region formed on the semiconductor substrate;
a first channel region between the first drain region and the first source region;
a first switching layer on the first channel region, the first switching layer having a resistance state, the first switching layer configured to switch the resistance state of the first switching layer between a high resistance state and a low resistance state;
a first charge trap layer on the first channel region, the first charge trap layer configured to trap or de-trap charges according to the resistance state of the first switching layer;
a first gate electrode on the first channel region, the first gate electrode configured to apply a voltage to the first switching layer;
a second drain region and a second source region formed on the semiconductor substrate;
a second channel region between the second drain region and the second source region; and
a second gate electrode on the second channel region.

19. The non-volatile inverter of claim 18, wherein
the semiconductor substrate includes a P-type semiconductor substrate, and
the first channel region includes an N-type well.

20. The non-volatile inverter of claim 18, further comprising:
a second switching layer on the second channel region, the second switching layer having a resistance state, the second switching layer being configured to switch the resistance state of the second switching layer between a high resistance state and a low resistance state, and
a second charge trap layer between the second channel region and the second gate electrode, the second charge trap layer being configured to trap or de-trap charges according to the resistance state of the second switching layer.

21. The non-volatile inverter of claim 18, wherein the first switching layer has a resistance value equal to or greater than about $1 \times 10^9$ ohms when the resistance state of the first switching layer is the high resistance state.

22. The non-volatile inverter of claim 18, wherein the first switching layer includes at least one of a chalcogenide-based material and a transition metal oxide.

23. The non-volatile inverter of claim 18, wherein the first switching layer includes a nano-filamentary material having nano-filaments, the first switching layer being configured to switch to a low resistance state based on the nano-filaments.

24. The non-volatile inverter of claim 23, wherein the nano-filamentary material includes $TiO_2$.

25. The non-volatile inverter of claim 18, wherein the first switching layer includes a P-N diode.

26. The non-volatile inverter of claim 25, wherein
the non-volatile inverter includes a gate insulating layer, the gate insulating layer having a tunneling voltage; and
the P-N diode has a breakdown voltage, the breakdown voltage being smaller than the tunneling voltage.

27. The non-volatile inverter of claim 18, further comprising:
an input electrode configured to connect the first gate electrode to the second gate electrode, the input electrode further configured to apply an input voltage to the first gate electrode and the second gate electrode.

28. The non-volatile inverter of claim 27, further comprising:
a first electrode on the first drain region;
a second electrode on both the first source region and the second drain region; and a third electrode on the second source region.

29. The non-volatile inverter of claim 28, further comprising:

a passivation layer covering an upper portion of the semiconductor substrate;

wherein,
the first electrode extends through the passivation layer and is electrically coupled to the first drain region through the passivation layer,
the third electrode extends through the passivation layer and is electrically coupled to the second source region through the passivation layer,
the input electrode extends through the passivation layer and is electrically coupled to the first and second gate electrodes through the passivation layer, and
the second electrode extends through the passivation layer and is electrically coupled to the first source region and the second drain region through the passivation layer.

* * * * *